United States Patent
Zheng et al.

(10) Patent No.: US 12,114,470 B2
(45) Date of Patent: Oct. 8, 2024

(54) POWER CABINET

(71) Applicant: Sungrow Power Supply Co., Ltd., Hefei (CN)

(72) Inventors: Hao Zheng, Hefei (CN); Qiyao Zhu, Hefei (CN); Jun Tan, Hefei (CN)

(73) Assignee: Sungrow Power Supply Co., Ltd., Hefei (CN)

( * ) Notice: Subject to any disclaimer, the term of this patent is extended or adjusted under 35 U.S.C. 154(b) by 280 days.

(21) Appl. No.: 17/592,553

(22) Filed: Feb. 4, 2022

(65) Prior Publication Data

US 2022/0272876 A1 Aug. 25, 2022

(30) Foreign Application Priority Data

Feb. 19, 2021 (CN) .......................... 202110189186.X

(51) Int. Cl.
*H05K 7/20* (2006.01)
*H02B 1/56* (2006.01)
*H02M 7/00* (2006.01)

(52) U.S. Cl.
CPC ........ *H05K 7/20909* (2013.01); *H02M 7/003* (2013.01); *H02B 1/565* (2013.01)

(58) Field of Classification Search
None
See application file for complete search history.

(56) References Cited

U.S. PATENT DOCUMENTS

| | | | | |
|---|---|---|---|---|
| 3,646,400 A | * | 2/1972 | Demarest | H01L 25/03 361/689 |
| 5,544,012 A | * | 8/1996 | Koike | H05K 7/20572 165/122 |
| 7,817,419 B2 | * | 10/2010 | Illerhaus | H02J 7/35 165/104.33 |
| 7,929,301 B2 | * | 4/2011 | Fong | H05K 5/063 363/141 |
| 10,038,391 B2 | * | 7/2018 | Zhao | H05K 7/2059 |
| 2012/0014154 A1 | * | 1/2012 | Siracki | H05K 7/20918 363/141 |
| 2013/0107455 A1 | | 5/2013 | Cottet et al. | |
| 2014/0063739 A1 | * | 3/2014 | Liu | H05K 7/20909 361/695 |
| 2018/0249595 A1 | * | 8/2018 | Ashbaugh | H05K 7/206 |

(Continued)

FOREIGN PATENT DOCUMENTS

| | | |
|---|---|---|
| CN | 203675519 U | 6/2014 |
| CN | 206302348 U | 7/2017 |

(Continued)

OTHER PUBLICATIONS

Extended European Search Report for European Application No. 22155630.1, dated Jul. 15, 2022.

*Primary Examiner* — Courtney L Smith
(74) *Attorney, Agent, or Firm* — Wolf, Greenfield & Sacks, P.C.

(57) ABSTRACT

The present application discloses a power cabinet, which is designed as a form of cabinet. All devices in the power cabinet are categorized into two types, and the two types of devices can have their own heat-dissipation channels or share a same heat-dissipation channel, which has a compact overall structure and high heat-dissipation efficiency compared with an air duct layout solution in the conventional technology.

18 Claims, 6 Drawing Sheets

(56) References Cited

U.S. PATENT DOCUMENTS

| | | |
|---|---|---|
| 2018/0352685 A1 | 12/2018 | Wan et al. |
| 2020/0187391 A1 | 6/2020 | Zhu et al. |
| 2021/0391824 A1 | 12/2021 | Zheng et al. |

FOREIGN PATENT DOCUMENTS

| | | |
|---|---|---|
| CN | 107171570 A | 9/2017 |
| CN | 109361240 A | 2/2019 |
| CN | 111587051 A | 8/2020 |
| CN | 112236018 A | 1/2021 |

* cited by examiner

POWER CABINET

CROSS REFERENCE TO RELATED DISCLOSURES

The present disclosure claims the priority to Chinese Patent Disclosure No. 202110189186.X titled "POWER CABINET", filed with the China National Intellectual Property Administration on Feb. 19, 2021, which is incorporated herein by reference in its entirety.

FIELD

The present disclosure relates to the technical field of air duct layout, and in particular to a power cabinet.

BACKGROUND

At present, with the gradually realization of getting the power on the grid from large-scale photovoltaic power plants in fair price, a photovoltaic grid-connected inverter, as an interface equipment between a solar power system and the grid, is facing increasingly strong power requirements, this is because that the higher power means the lower cost per watt, and the photovoltaic grid-connected inverter plays a significant role on getting the power on the grid in fair price.

As the power of the photovoltaic inverter increases, the heat generation thereof also gradually increases, and thus its own air duct design is particularly important. In order to meet the market cost index, the photovoltaic inverter is required to configure an air duct according to the heat generation of each device to achieve an optimal layout structure.

There are two air duct layout solutions in the conventional technology. One is container air duct layout solution, which has a relatively simple structure but does not have cost advantage. The other one is the air duct layout solution shown in FIG. 1, which is suitable for outdoor cabinet inverter structure, but the overall layout solution is too complex, resulting in low heat-dissipation efficiency.

SUMMARY

In view of this, a power cabinet is provided according to the present disclosure, so as to reduce its overall cost and improve its own heat dissipation efficiency.

In order to achieve the above object, the following technical solutions are provided according to the present disclosure:
  a power cabinet is provided according to the present disclosure, which includes a cabinet body and at least two devices arranged in an interior of the cabinet body;
  a device in first type is arranged in a main heat-dissipation channel in communication with the cabinet body;
  a device in second type is arranged in the main heat-dissipation channel or a secondary heat-dissipation channel which is in communication with the cabinet body;
  the main heat-dissipation channel and the secondary heat-dissipation channel share one same outlet, or have at least one outlet, respectively.

In an embodiment, the device in first type is a device with a heat generation amount exceeding a heat generation threshold;
  the main heat-dissipation channel is a direct air-cooling heat-dissipation channel.

In an embodiment, the device in first type includes an electric reactor and a heat dissipater for dissipating heat for a power unit.

In an embodiment, the device in second type includes with a protection requirement level exceeding a preset protection level;
  the secondary heat-dissipation channel is a direct air-cooling heat-dissipation channel or a heat exchange air-cooling heat-dissipation channel.

In an embodiment, the device in first type and the device in second type comprise an inverter power unit, the device in second type comprises a DC power distribution unit, an AC switch and a control unit.

In an embodiment, the direct air-cooling heat-dissipation channel includes at least one sub heat-dissipation channel:
  in a case that one sub heat-dissipation channel is provided, the corresponding devices are sequentially arranged in the one sub heat-dissipation channel along a heat-dissipation direction;
  in a case that more than one sub heat-dissipation channel is provided, the corresponding devices are arranged in the sub heat-dissipation channels, respectively, and the sub heat-dissipation channels have a corresponding inlet, respectively.

In an embodiment, in the case that one sub heat-dissipation channel is provided, the one sub heat-dissipation channel is in type of straight-through, or the one sub heat-dissipation channel is divided into at least two sections in communication with each other, and each device is arranged in the corresponding section, respectively.

In an embodiment, in a case that more than one sub heat-dissipation channels are provided, all the sub heat-dissipation channels share one same outlet after being converged, or each of the sub heat-dissipation channels has a corresponding outlet, respectively.

In an embodiment, the direct air-cooling heat-dissipation channel further includes at least one air blower chamber;
  each air blower chamber is arranged at the inlet of the corresponding sub heat-dissipation channel; each air blower chamber is arranged at the inlet of the corresponding sub heat-dissipation channel;
  at least one air blower is provided in each air blower chamber or in the corresponding sub heat-dissipation channel.

In an embodiment, in the case that more than one sub heat-dissipation channels are provided,
  a partition plate or a gap is provided between each air blower chamber; or
  the air blower chambers are combined into one air blower chamber.

In an embodiment, a corresponding air outlet structure is provided outside the outlet of each sub heat-dissipation channel, respectively, or a common air outlet structure is provided outside the outlets of the sub heat-dissipation channels;
  and/or
  a corresponding air inlet structure is provided outside the inlet of each sub heat-dissipation channel, respectively, or a common air inlet structure is provided outside the inlet of the sub heat-dissipation channels.

In an embodiment, the air outlet structure and the air inlet structure are arranged on opposite or adjacent surfaces of the cabinet body, respectively, or arranged on two ends of a same surface of the cabinet body, respectively.

In an embodiment, the air outlet structure and the air inlet structure both include a waterproof louver structure and/or a dust-proof silk screen structure.

In an embodiment, the device in second type is arranged in an independent chamber;

the secondary heat-dissipation is a heat exchange air-cooling heat-dissipation channel, which includes a heat exchanger, an external circulation air duct inlet and an external circulation air duct outlet;

the heat exchanger is arranged on one side of the cabinet body and includes an external circulation air blower and an internal circulation air blower;

the external circulation air duct inlet and the external circulation air duct outlet are both in communication with an external circulation air duct provided by the external circulation air blower;

the device in second type is located in an internal circulation air duct provided by the internal circulation air blower.

In an embodiment, in a case that the heat exchanger is arranged at a top of the power cabinet, the external circulation air duct is a chamber between an inner top and an outer top of the power cabinet;

in a case that the heat exchanger is arranged at a bottom of the power cabinet, the external circulation air duct is an compartment arranged at the bottom of the power cabinet.

In an embodiment, an external circulation air duct baffle is arranged in the external circulation air duct and divides the external circulation air duct into: an external circulation air inlet chamber in communication with the external circulation air duct inlet, and an external circulation air outlet chamber in communication with the external circulation air duct outlet; and/or an internal circulation air duct baffle is arranged in the internal circulation air duct and divides the internal circulation air duct into: an internal circulation air inlet chamber in communication with an internal circulation air duct inlet, and an internal circulation air outlet chamber in communication with an internal circulation air duct outlet.

In an embodiment, at least one circulation turbulence air blower is further provided in the internal circulation air duct.

In an embodiment, an air inlet structure is provided outside the external circulation air duct inlet; and/or an air outlet structure is provided outside the external circulation air duct outlet.

In an embodiment, the air inlet structure and the air outlet structure are arranged on opposite surfaces of the cabinet body, respectively, or arranged on two ends of a same surface of the cabinet body, respectively.

In an embodiment, the air outlet structure and the air inlet structure both include a waterproof louver structure and/or a dust-proof silk screen structure.

It can be know from the above technical solution that the power cabinet is provided according to the present disclosure. Since the power cabinet is designed as a form of cabinet, the structural cost is reduced compared with a container solution in the conventional technology. In addition, all devices in the power cabinet are categorized into two types, and the two types of devices can have their own heat-dissipation channels or share the same heat-dissipation channel, which has a compact overall structure and high heat dissipation efficiency compared with an air duct layout solution shown in FIG. 1. Therefore, the power cabinet provided according to the present disclosure not only reduces its overall cost, but also improves its own heat dissipation efficiency.

BRIEF DESCRIPTION OF THE DRAWINGS

For more clearly illustrating embodiments of the present disclosure or technical solutions in the conventional technology, the drawings referred to for describing the embodiments or the conventional technology will be briefly described hereinafter. Apparently, the drawings in the following description are only some examples of the present disclosure, and for those skilled in the art, other drawings may be obtained based on the provided drawings without any creative efforts.

DETAILED DESCRIPTION OF THE EMBODIMENTS

Technical solutions in the embodiments of the present disclosure are clearly and completely described below in conjunction with the drawings of the embodiments of the present disclosure. Apparently, the embodiments described in the following are only some embodiments of the present disclosure, rather than all of the embodiments. All the other embodiments obtained by those skilled in the art based on the embodiments in the present disclosure without any creative work fall into the scope of the present disclosure.

The relationship terms such as "first", "second" and the like herein are only used herein to distinguish one entity or operation from another, rather than to necessitate or imply existence of an actual relationship or order between the entities or operations. Furthermore, terms "include", "comprise" or any other variants thereof are intended to be non-exclusive. Therefore, a process, method, article or device including a series of elements includes not only the elements but also other elements that are not enumerated or other elements inherent to such process, method, article or device. Unless expressively limited otherwise, a process, method, article or device limited by "comprising/including a(n) . . . " does not exclude existence of another identical element in the process, method, article or device.

According to the above description of the disclosed embodiments, features described in the embodiments of the present disclosure may be replaced or combined with each other, so that those skilled in the art may implement or practice the present disclosure. The above description is merely a preferred embodiment of the present disclosure and does not limit the present disclosure in any form. Preferred embodiments of the present disclosure are disclosed above, and are not intended to limit the present disclosure. Numerous alternations, modifications and equivalents can be made to the technical solutions of the present disclosure by those skilled in the art in light of the methods and technical contents disclosed herein without departing from the scope of the present disclosure. Therefore, any simple changes, equivalent variations and modifications on the above embodiments made according to the technical essence of the present disclosure without departing the content of the technical solutions of the present disclosure fall within the scope of protection of the technical solutions of the present disclosure.

Figure 2A:
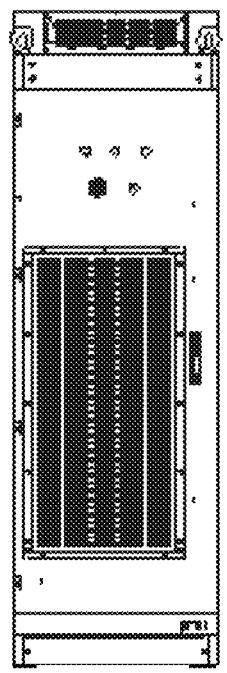
FIGS. 2a and 2b are a schematic front view and a schematic back view of a power cabinet provided according to an embodiment of the present disclosure, respectively.
Figure 2B:
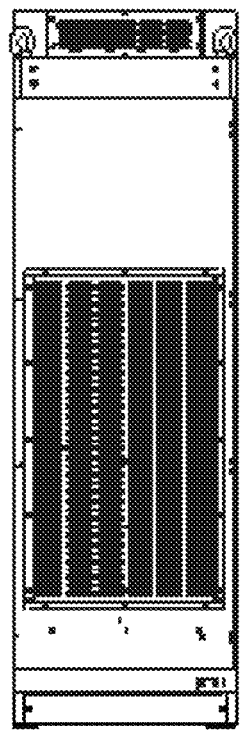

In order to reduce the overall cost and improve the heat dissipation efficiency, a power cabinet is provided according to the present disclosure, the appearance of which is shown in FIG. 2a and FIG. 2b, and the specific structure can be in FIGS. 3a to 3c and FIG. 4. The power cabinet specifically includes a cabinet body 100 and at least two devices arranged in the interior of the cabinet body 100.

In the power cabinet, the devices can be categorized into two types according to the amount of heat dissipation. In practical application, said classification method is included but not limited, and the classification methods are not specifically limited hereto and can be determined according to the specific circumstance, which will fall within the protection scope of the present disclosure. Specifically, the device with a heat generation amount exceeding a heat generation threshold can be set as a device in first type, such as an electric reactor and a heat dissipater for dissipating heat for a power unit; and other devices are all device in second types.

In practical application, the device in second type may be a device with a protection requirement level exceeding a preset protection level, for example, a DC power distribution unit, an AC switch and a control unit as the inverter in the power cabinet in a case that the power unit is configured as an inverter power unit. Preferably, the device in second type may be separately arranged an independent chamber, so as to ensure to meet the protection requirement.

It should be noted that the heat generation threshold is a preset heat productivity to distinguish whether the heating generation amount of the device is large, that is, the heating generation amount of the device is high in a case that the heating generation amount of the device exceeds the heat generation threshold, and the heating generation amount of the device is low in a case that the heating generation amount of the device does not exceed the heat generation threshold. The protection requirement level is a preset protection level to distinguish whether the protection requirement level of the device is high, that is, the protection level requirement of the device is high in a case that the protection level requirement of the device exceeds the preset protection level, and the protection level requirement of the device is low in a case that the protection level requirement of the device does not exceed the preset protection level.

The device in first type is arranged in a main heat-dissipation channel in communication with the cabinet body 100, the main heat-dissipation channel is preferably a direct air-cooling heat-dissipation channel, so as to ensure to meet the requirement for high heat dissipation of the device in first type. The device in second type may be arranged in the main heat-dissipation channel together with the device in first type, or arranged in a secondary heat-dissipation channel which is in communication with the cabinet body 100. If the device in second type is arranged in the secondary heat-dissipation channel, the main heat-dissipation channel and the secondary heat-dissipation channel may share the same outlet, or each has at least one outlet.

Optionally, the secondary heat-dissipation channel may be another direct air-cooling heat-dissipation channel or a separate heat exchange air-cooling heat-dissipation channel in the cabinet body 100, which is not specifically limited hereto, can be determined according to specific circumstance, and will fall within the protection scope of the present disclosure. In practical application, the secondary heat-dissipation channel is preferably a heat exchange air-cooling heat-dissipation channel, so as to improve the protection level of the device in second type therein, thereby ensuring the reliable operation of the device in first type and the device in second type.

Figure 1:
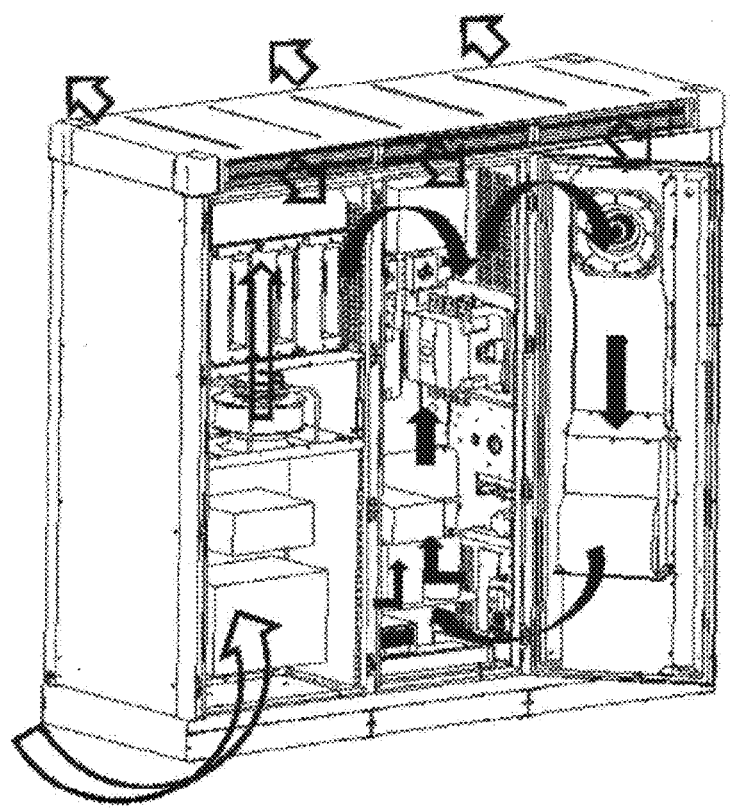
FIG. 1 is a schematic structural view of an inverter power cabinet in the conventional technology.

Since the power cabinet is designed as a form of cabinet, the structural cost is reduced compared with a form of container applied in the conventional technology. In addition, all devices in the power cabinet are categorized into two types, and the two types of devices can have their own heat-dissipation channels or share one same heat-dissipation channel, which has a compact overall structure and high heat dissipation efficiency compared with an air duct layout solution shown in FIG. 1. In addition, different types of devices are arranged in different heat-dissipation channels, and a corresponding heat dissipation method can be provided for the different types of devices, so as to meet the requirement for heat dissipation of the different types of devices. Specifically, the direct air-cooling heat-dissipation channel is provide only for the device in first type with the heat generation amount exceeding the heat generation threshold, and all other device in second types dissipate heat by means of said direct air-cooling heat-dissipation channel, or are just arranged in the second heat-dissipation channel.

In summary, the power cabinet provided according to the present disclosure not only reduces its overall cost, but also improves its own heat dissipation efficiency.

Another embodiment of the present disclosure provides several implementation modes of the direct air-cooling heat-dissipation channel. The specific structure can be shown in FIGS. 3a to 3c and FIG. 4, which specifically includes at least one sub heat-dissipation channel.

In a case that one sub heat-dissipation channel is provided, the corresponding devices, such as the device in first types, are sequentially arranged in the one sub heat-dissipation channel along a heat-dissipation direction (not shown). In a case that more than one sub heat-dissipation channels are provided, the corresponding devices, such as the device in first types, are arranged in these heat-dissipation channels, respectively, and each of the sub heat-dissipation channels has a corresponding inlet (as shown in FIG. 3a).

Figure 3A:
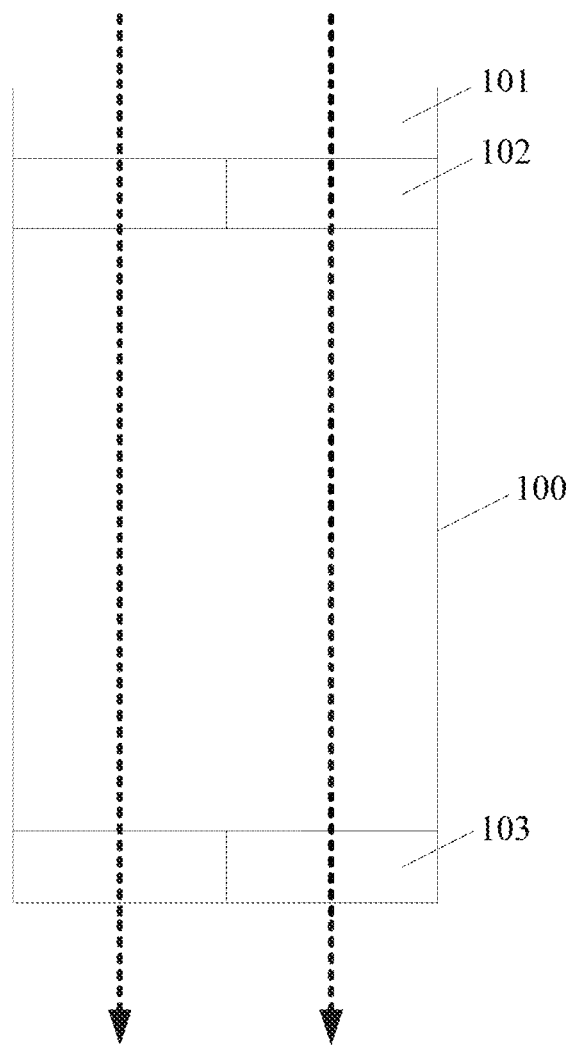
FIG. 3a is a schematic view of a main heat-dissipation channel provided according to the embodiment of the present disclosure.

Optionally, in the case that more than one sub heat-dissipation channels are provided, all the sub heat-dissipation channels may share one same outlet after being converged (not shown), or the heat-dissipation channels can have their own corresponding outlet (as shown in FIG. 3a).

In addition, in the case that one sub heat-dissipation channel is provided, the one sub heat-dissipation channel is a type of straight-through, the corresponding devices, such as the device in first types, are arranged in the straight-through sub heat-dissipation channel in series, and the devices with high requirement for heat dissipation can be arranged at a head end of the heat-dissipation direction. Alternatively, in the case that one sub heat-dissipation channel is provided, the one sub heat-dissipation channel is divided into at least two sections in communication with each other, which are in a shape similar to zigzag, and then the corresponding devices, such as the device in first types, may be arranged in the corresponding sections, respectively, thereby meeting the requirement to a large air volume for the devices located in a middle section while avoiding the mutual interference between the two air ducts in the case of presenting more than one sub heat-dissipation channels.

Preferably, the direct air-cooling heat-dissipation channel further includes at least one air blower chambers 102, where each air blower chamber 102 corresponds to one sub heat-dissipation channel. Each of the at least one air blower chambers 102 is arranged at an inlet of the corresponding sub heat-dissipation channel, and at least one air blower is provided in the air blower chamber 102 or the corresponding sub heat-dissipation channel. The number and the type of the air blower are not limited, as long as it can dissipate heat for the device in the corresponding sub heat-dissipation channel. The position is not limited to an interior of the air blower chamber, and the air blower may be placed at any positions in the corresponding sub heat-dissipation channel. In addition, several air blowers may also be arranged in the same sub-heat-dissipation channel in series.

When one of the devices in first types has low heat generation or low requirement to the ambient temperature, it can be placed in one air duct in series. Further, it can also meet the requirement for heat-dissipation to the device with only one air blower chamber 102.

Preferably, in the case that more than one sub heat-dissipation channels are provided, a partition plate may be provided between each air blower chamber 102 to achieve complete isolation, or a gap may be appropriately provided therebetween. If all the sub heat-dissipation channels shares the same one outlet after being converged, the wind pressure is not much different, so that the performance of the main air channel and the air blowers can be maximized, which can be specially verified by experiments, which can be verified by experiments. If each of sub heat-dissipation channels has a corresponding outlet (as shown in FIG. 3a), when one of the first air blower and the second air blower has insufficient air volume or insufficient air pressure so as to affect the heat-dissipation to the corresponding devices, the intermediate partition plate or gap can be removed to meet the heat-dissipation requirements to the corresponding devices. In addition, when the heat-dissipation to the corresponding devices meets the requirements, the two sub-air blower chambers can be merged into one single sub-air blower chamber, and the two air blowers can be merged into one single air blower to achieve cost optimization.

Figure 3B:
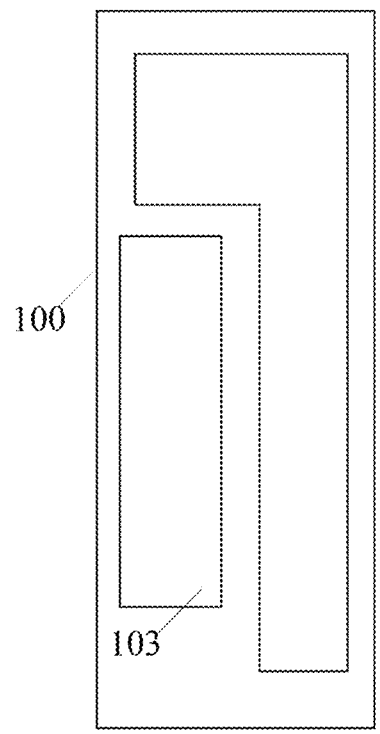
FIGS. 3b and 3c are schematic views of two kinds of air outlets of the main heat-dissipation channel provided according to the embodiment of the present disclosure, respectively.
Figure 3C:
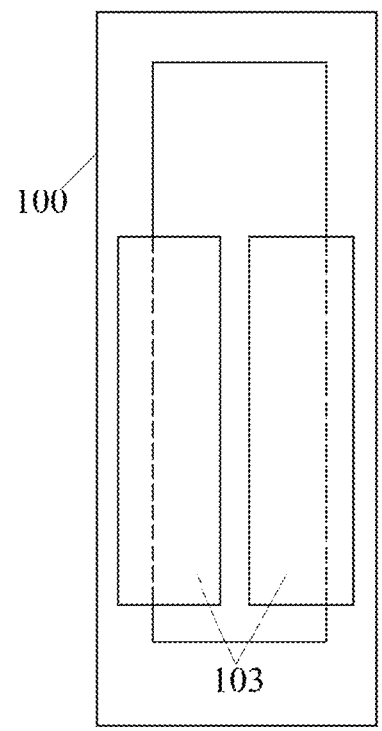

Regarding an air outlet structure 103, a common air outlet structure 103 may be provided outside the outlets of each of sub heat-dissipation channels (as shown in FIG. 3b). In addition, when the air flow area shown in FIG. 3b cannot meet the requirement for an air exhaust area of the two air blower chambers 102 in a case that the heat generation of the device in first type is large, or the air pressures in the two air blower chambers are different due to different specifications of two air blowers 102 or different air duct structures in the two air blower chambers 102, it may cause unorganized airflow in the two air blower chambers, which cannot dissipate heat effectively, an air outlet can be separately provided for each of the two air blower chambers 102, and thus the two sub heat-dissipation channels do not interfere with each other, that is, an air outlet structure 103 is provided outside the corresponding outlet of each sub heat-dissipation channel (as shown in FIG. 3a or 3c).

A corresponding air inlet structure 101 is provided outside the inlet of each sub heat-dissipation channel (not shown), respectively, or a common air inlet structure 101 is provided outside the inlets of sub heat-dissipation channels (as shown in FIG. 3a).

Figure 4:
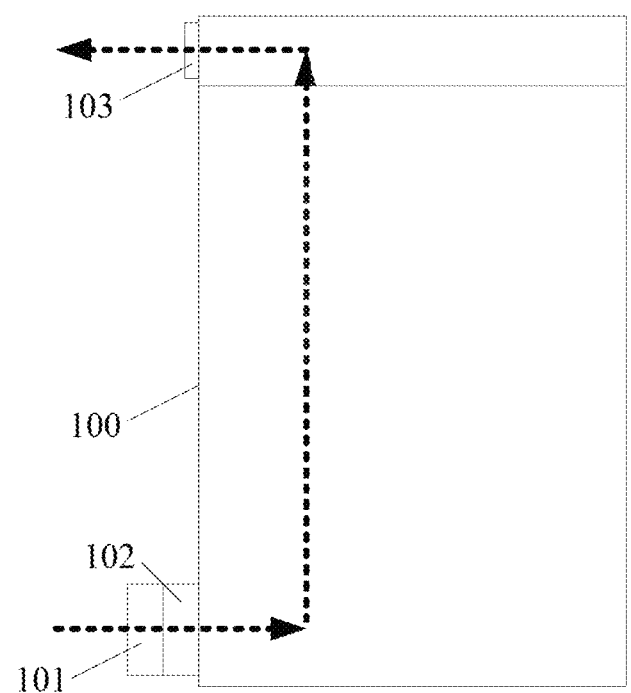
FIG. 4 is another schematic view of the main heat-dissipation channel provided according to the embodiment of the present disclosure.

Preferably, the air outlet structure 103 and the air inlet structure 101 are arranged on opposite surfaces of the cabinet body, respectively (as shown in FIG. 3a). For example, the air inlet structure 101 is arranged on a front surface of the cabinet body 100, and the air outlet structure 103 is arranged on a back surface of the cabinet body 100. Alternatively, the air outlet structure 103 and the air inlet structure 101 are arranged on two ends of a same surface of the cabinet body, respectively (as shown in FIG. 4). In practical application, the structures in FIG. 3a and FIG. 4 can be combined, that is, the air outlet structure 103 and the air inlet structure 101 are arranged on adjacent surfaces of the cabinet body, respectively. In addition, in practical application, the number of the air outlet structure 103 and the air inlet structure 101 is not specifically limited, and any combination of the methods shown in FIG. 3a and FIG. 4 can be used, which will fall within the protection scope of the present disclosure.

Preferably, both the air inlet structure 101 and the air outlet structure 103 include a waterproof louver structure and/or a dust-proof silk screen structure.

In summary, the solution of sharing the same outlet after all the sub heat-dissipation channels being converged and the solution with the one single air outlet structure 103 shown in FIG. 3b are more appropriate, which can ensure the small size of the overall cabinet body and reliable heat-dissipation.

In addition, in combination with the above solutions, it can be understood that the views in FIGS. 3a to 3 are taken as side views of the whole cabinet body. As shown in FIG. 4, a direction of the main heat-dissipation channel is set as a vertical direction, and multiple solutions can be derived according to different positions of the device, where the device in first types can be placed in a vertical direction, the air inlet can be located at a top or a side lower part while the air outlet is located at a side top part. The air inlets of different device in first types can be located at a bottom or on two sides of lower part of the cabinet body, respectively, and the airflows of the two air inlet ducts are converged together after passing through the heating device and are exhausted from the top side. Alternatively, each of different devices in first types can be provided with two sub heat-dissipation channels, and the air inlet and the air outlet of which are located at the bottom or the side lower part and at the side top part, respectively. The number and the type of the air blower in the solution are not limited, and the position is not limited to the interior of the air blower chamber, which may be placed at any positions in the corresponding sub heat-dissipation channel or multiple air blowers may be arranged in the same sub heat-dissipation channel. In addition, the air flow direction of the respective heat-dissipation channels is not limited to be from bottom to top, but can also be from top to bottom.

Considering that the amount of heat generation of other devices, such as the device in second type, is different from that of the device in first types, they can be placed in a chamber where the device in first types are located so that the heat dissipation to them can be made by the main heat-dissipation channel. In that case, the direction of the air duct of the main heat-dissipation channel may be the horizontal or vertical direction described in the above embodiment. Alternatively, a separate secondary heat-dissipation channel may be provided for the other devices, which can also be a direct air-cooling heat-dissipation channel, and the direction of the air duct may be flow-in from front and flow-out from back, flow-in from top and flow-out from bottom or flow-out from top and flow-in from back. Besides, the cases should be avoided that the air inlet and the air outlet are provided on the same side of the cabinet body, which may cause unorganized airflow. If the distance between the air inlet and the air outlet is large enough, it can also meet the requirement for heat-dissipation.

Further, considering that the device in second types have a high protection requirement level, they are preferably arranged in an independent chamber, and the independent secondary beat-dissipation channel of which is preferably a heat exchange air-cooling heat-dissipation channel. Another embodiment of the present disclosure provides several implementation modes of the heat exchange air-cooling heat-dissipation channel. The specific structure can be seen in FIG. 5a and FIG. 5b, which specifically includes a heat exchanger, an external circulation air duct inlet 201 and an external circulation air duct outlet 205.

The heat exchanger is arranged on one side of the power cabinet 100 and includes an external circulation air blower 202 and an internal circulation air blower 203. The external circulation air duct inlet 201 and the external circulation air duct outlet 205 are both in communication with an external circulation air duct provided by the external circulation air blower 202, and the device in second type is located in an internal circulation air duct provided by the internal circulation air blower 203.

Figure 5A:
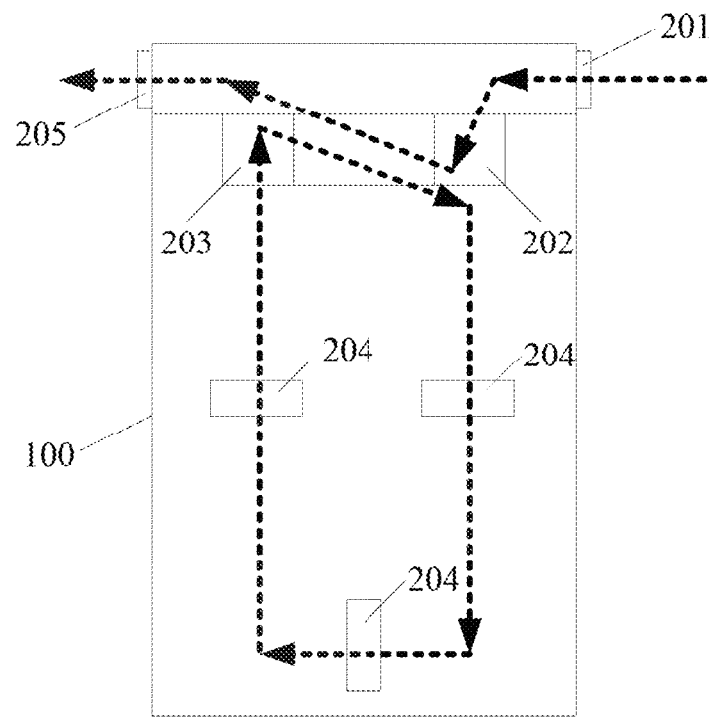
FIGS. 5a and 5b are two schematic structural views of a heat exchange air-cooling heat-dissipation channel provided according to the embodiment of the present disclosure, respectively.
Figure 5B:
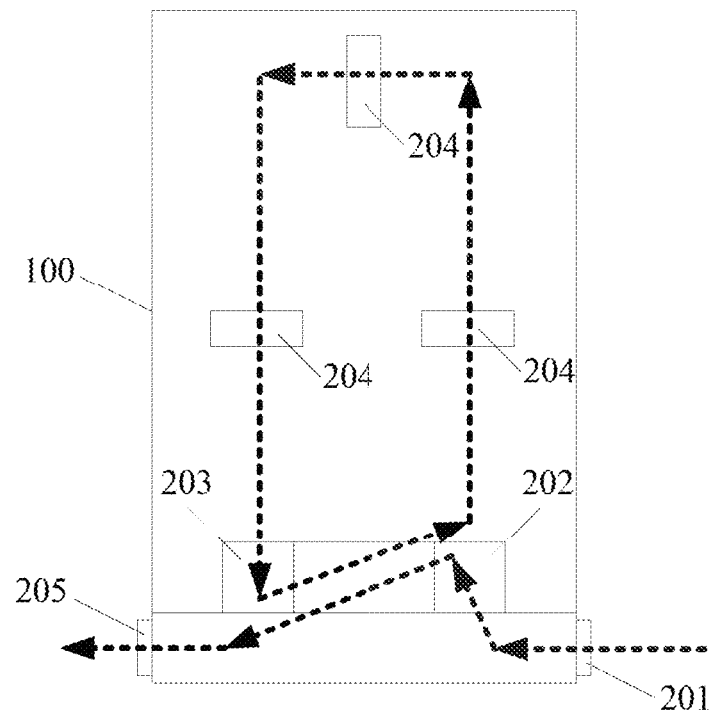

Taking FIGS. 5a and 5b as an example, when the heat exchange air-cooling heat-dissipation channel shown in FIGS. 5a and 5b is in normal operation, the external air enters the heat exchanger from the external circulation air duct by the external circulation air blower 202, and exchanges heat with the internal air entering the internal circulation air duct in the heat exchanger. The heat is dissipated from the heat exchanger to the external circulation air duct, and thus the temperature of the external air in the external circulation air duct increases.

In the internal circulation air duct of the heat exchanger, the internal air of the internal circulation air duct is blown into the heat exchanger driven by the internal circulation air blower 203, and exchanges heat with the external air of the external circulation air duct through the heat exchanger, so that the temperature of the internal air is decreased.

It should be noted that each the device in second types may be sequentially arranged in the internal circulation air duct. In practical application, other arrangement is not excluded, which is not specifically limited here, and can be determined according to the specific circumstance, all of them will fall within the protection scope of the present disclosure.

Optionally, the heat exchanger may be arranged at a top of the power cabinet 100 (as shown in FIG. 5a), or at a bottom of the power cabinet 100 (as shown in FIG. 5b). In practical application, the above two implementation modes are included but not limited hereto, which is not specifically limited hereto and can be determined according to the specific circumstance, and will fall within the protection scope of the present disclosure. Preferably, the heat exchanger is arranged at the top of the power cabinet 100, which not only provides a high protection level for the device in second types, but also has a compact structure.

Accordingly, in the case that the heat exchanger is arranged at the top of the power cabinet 100, as shown in FIG. 5a, the external circulation air duct is a chamber between an inner top and an outer top of the power cabinet 100. In the case that the heat exchanger is arranged at the bottom of the power cabinet 100, as shown in FIG. 5b, the external circulation air duct is a compartment arranged at the bottom of the power cabinet 100.

It should be noted that when there is no unorganized wind at the external circulation air duct inlet 201 and the external circulation air duct outlet 205, the external circulation air duct may have an open structure.

Specifically, an external circulation air duct baffle may be provided in the external circulation air duct, which divides the external circulation air duct into an external circulation air inlet chamber in communication with the external circulation air duct inlet 201, and an external circulation air outlet chamber in communication with the external circulation air duct outlet 205. An internal circulation air duct baffle may also be provided in the internal circulation air duct, which divides the internal circulation air duct into an internal circulation air inlet chamber in communication with the inlet of the internal circulation air duct, and an internal circulation air outlet chamber in communication with the outlet of the internal circulation air duct.

Considering the possibility of the cabinet body with a large size, an internal circulation turbulence air blower can be selectively used to ensure the smoothness of the internal circulation air duct. That is, at least one circulation turbulence device 204 may be provided in the internal circulation air duct, or the circulation turbulence device 204 may not be provided, which is not specifically limited, and can be determined according to the degree of disturbance in the internal circulation air duct, and will fall within the protection scope of the present disclosure. In addition, the number of the circulation turbulence device 204 can also be determined according to the degree of disturbance in the internal circulation air duct.

The position of the circulation turbulence device 204 is not limited, which can be any position, and is not limited to positions shown in FIGS. 5a and 5b. In a case of only one circulation turbulence device 204, it is preferably arranged at a distal end of the internal circulation air duct as shown in FIGS. 5a and 5b, that is, the end away from the heat exchanger, so as to improve the degree of disturbance in the internal circulation air duct with a low cost.

Optionally, the circulation turbulence device 204 is an air blower. In practical application, this implementation mode is included but not limited, which can be determined according to specific circumstance, and will fall within the protection scope of the present disclosure.

Optionally, protection devices are provided outside the external circulation air duct inlet 201 and the external circulation air duct outlet 205, respectively. In practical application, the case without the protection devices is not excluded, which is not specifically limited, and can be determined according to specific circumstance, and will fall within the protection scope of the present disclosure.

It should be noted that, as shown in FIG. 5a and FIG. 5b, in a case that the protection device is arranged outside the external circulation air duct inlet, it is referred as the air inlet structure, and in a case that the protection device is arranged outside the external circulation air duct outlet, it is referred as the air outlet structure.

Optionally, the air inlet structure and the air outlet structure are arranged on opposite surfaces of the cabinet body 100, respectively, or arranged on two ends of a same surface of the cabinet body 100, respectively.

Optionally, the air outlet structure and the air inlet structure both include a waterproof louver structure, or a dust-proof silk screen structure, or a waterproof louver structure and a dust-proof silk screen structure. In practical application, the implementation modes are included but not limited, which is not specifically limited and can be determined according to specific circumstance, and will fall within the protection scope of the present disclosure.

According to the above description of the disclosed embodiments, features described in the embodiments of the present disclosure may be replaced or combined with each other, so that those skilled in the art may implement or practice the present disclosure. The above description is merely a preferred embodiment of the present disclosure and does not limit the present disclosure in any form. Preferred embodiments of the present disclosure are disclosed above, and are not intended to limit the present disclosure. Numerous alternations, modifications and equivalents can be made to the technical solutions of the present disclosure by those skilled in the art in light of the methods and technical contents disclosed herein without departing from the scope of the present disclosure. Therefore, any simple changes, equivalent variations and modifications on the above embodiments made according to the technical essence of the present disclosure without departing the content of the technical solutions of the present disclosure fall within the scope of protection of the technical solutions of the present disclosure.

The invention claimed is:

1. A power cabinet, comprising a cabinet body and at least two devices arranged in an interior of the cabinet body;
   wherein a device in first type is arranged in a main heat-dissipation channel in communication with the cabinet body;
   a device in second type is arranged in the main heat-dissipation channel or a secondary heat-dissipation channel which is in communication with the cabinet body;
   the main heat-dissipation channel and the secondary heat-dissipation channel share one same outlet, or each of the main heat-dissipation channel and the secondary heat-dissipation channel has at least one outlet,
   wherein the device in first type is a device with a heat generation amount exceeding a heat generation threshold;
   the main heat-dissipation channel is a direct air-cooling heat-dissipation channel,
   wherein the device in second type is arranged in an independent chamber;
   the secondary heat-dissipation channel is a heat exchange air-cooling heat-dissipation channel, which comprises a heat exchanger, an external circulation air duct inlet and an external circulation air duct outlet;
   the heat exchanger is arranged on one side of the cabinet body and comprises an external circulation air blower and an internal circulation air blower;
   the external circulation air duct inlet and the external circulation air duct outlet are both in communication with an external circulation air duct provided by the external circulation air blower;
   the device in second type is located in an internal circulation air duct provided by the internal circulation air blower.

2. The power cabinet according to claim 1, wherein the device in first type comprises an electric reactor and a heat dissipater, the heat dissipater is configured to dissipate heat for a power unit for dissipating heat for a power unit.

3. The power cabinet according to claim 1, wherein the device in second type comprises with a protection requirement level exceeding a preset protection level;
   the secondary heat-dissipation channel is a direct air-cooling heat-dissipation channel or a heat exchange air-cooling heat-dissipation channel.

4. The power cabinet according to claim 3, wherein in a case that the device in first type and the device in second type comprise an inverter power unit, the device in second type comprises a DC power distribution unit, an AC switch and a control unit.

5. The power cabinet according to claim 1, wherein the direct air-cooling heat-dissipation channel comprises at least one sub heat-dissipation channel;
   in a case that one sub heat-dissipation channel is provided, the corresponding devices are sequentially arranged in the one sub heat-dissipation channel along a heat-dissipation direction;
   in a case that more than one sub heat-dissipation channels are provided, the corresponding devices are arranged in the sub heat-dissipation channels, respectively, and the sub heat-dissipation channels have a corresponding inlet, respectively.

6. The power cabinet according to claim 5, wherein in the case that one sub heat-dissipation channel is provided, the one sub heat-dissipation channel is in type of straight-through, or the one sub heat-dissipation channel is divided into at least two sections in communication with each other, and each device is arranged in the corresponding section, respectively.

7. The power cabinet according to claim 5, wherein in the case that more than one sub heat-dissipation channels are provided, all the sub heat-dissipation channels shares one same outlet after being converged, or the sub heat-dissipation channels have a corresponding outlet, respectively.

8. The power cabinet according to claim 5, wherein the direct air-cooling heat-dissipation channel further comprises at least one air blower chamber;
   each air blower chambers corresponds to one sub heat-dissipation channel; each air blower chamber is arranged at the inlet of the corresponding sub heat-dissipation channel;
   at least one air blower is provided in each air blower chamber or in the corresponding sub heat-dissipation channel.

9. The power cabinet according to claim 8, wherein in the case that more than one sub heat-dissipation channels are provided, a partition plate or a gap is provided between each air blower chamber; or,
   the air blower chambers are combined into one air blower chamber.

10. The power cabinet according to claim 5, wherein a corresponding air outlet structure is respectively provided outside the outlet of each sub heat-dissipation channel, or a common air outlet structure is provided outside the outlets of the sub heat-dissipation channels; and/or
    a corresponding air inlet structure is respectively provided outside the inlet of each sub heat-dissipation channel, or a common air inlet structure is provided outside the inlet of the sub heat-dissipation channels.

11. The power cabinet according to claim 10, wherein the air outlet structure and the air inlet structure are respectively arranged on opposite or adjacent surfaces of the cabinet body, or arranged on two ends of a same surface of the cabinet body, respectively.

12. The power cabinet according to claim 10, wherein the air outlet structure and the air inlet structure both comprise a waterproof louver structure and/or a dust-proof silk screen structure.

13. The power cabinet according to claim 1, wherein in a case that the heat exchanger is arranged at a top of the power cabinet, the external circulation air duct is a chamber between an inner top and an outer top of the power cabinet;

in a case that the heat exchanger is arranged at a bottom of the power cabinet, the external circulation air duct is a compartment arranged at the bottom of the power cabinet.

14. The power cabinet according to claim 1, wherein an external circulation air duct baffle is arranged in the external circulation air duct and divides the external circulation air duct into:
  an external circulation air inlet chamber in communication with the external circulation air duct inlet, and an external circulation air outlet chamber in communication with the external circulation air duct outlet; and/or
  an internal circulation air duct baffle is arranged in the internal circulation air duct and divides the internal circulation air duct into:
  an internal circulation air inlet chamber in communication with an internal circulation air duct inlet, and an internal circulation air outlet chamber in communication with an internal circulation air duct outlet.

15. The power cabinet according to claim 1, wherein at least one circulation turbulence air blower is further provided in the internal circulation air duct.

16. The power cabinet according to claim 1, an air inlet structure is provided outside the external circulation air duct inlet; and/or
  an air outlet structure is provided outside the external circulation air duct outlet.

17. The power cabinet according to claim 16, wherein the air inlet structure and the air outlet structure are arranged on opposite surfaces of the cabinet body, respectively, or arranged on two ends of a same surface of the cabinet body, respectively.

18. The power cabinet according to claim 16, wherein the air outlet structure and the air inlet structure both comprise a waterproof louver structure and/or a dust-proof silk screen structure.

* * * * *